US012757638B2

(12) United States Patent
Imaji et al.

(10) Patent No.: US 12,757,638 B2
(45) Date of Patent: Oct. 6, 2026

(54) PIEZOELECTRIC FILM, TOUCH PANEL, AND PIEZOELECTRIC FILM MANUFACTURING METHOD

(71) Applicant: Kureha Corporation, Tokyo (JP)

(72) Inventors: Makoto Imaji, Tokyo (JP); Kei Yamaguchi, Tokyo (JP); Sho Hayakawa, Ibaraki (JP)

(73) Assignee: Kureha Corporation, Tokyo (JP)

( * ) Notice: Subject to any disclaimer, the term of this patent is extended or adjusted under 35 U.S.C. 154(b) by 804 days.

(21) Appl. No.: 18/250,474

(22) PCT Filed: Oct. 18, 2021

(86) PCT No.: PCT/JP2021/038367

§ 371 (c)(1),
(2) Date: Apr. 25, 2023

(87) PCT Pub. No.: WO2022/091828

PCT Pub. Date: May 5, 2022

(65) Prior Publication Data

US 2023/0397500 A1 Dec. 7, 2023

(30) Foreign Application Priority Data

Oct. 30, 2020 (JP) ................................ 2020-183103

(51) Int. Cl.
*H10N 30/88* (2023.01)
*C08J 7/04* (2020.01)
(Continued)

(52) U.S. Cl.
CPC .......... *H10N 30/883* (2023.02); *C08J 7/0427* (2020.01); *C08J 7/044* (2020.01);
(Continued)

(58) Field of Classification Search
CPC ...... H10N 30/883; H10N 30/30; G06F 3/041; G06F 2203/04105; G06F 3/0414;
(Continued)

(56) References Cited

U.S. PATENT DOCUMENTS

| | | | | |
|---|---|---|---|---|
| 9,343,653 | B2 * | 5/2016 | Kaimori | H10N 30/857 |
| 10,008,659 | B2 * | 6/2018 | Park | H10N 30/302 |

(Continued)

FOREIGN PATENT DOCUMENTS

| | | | | | |
|---|---|---|---|---|---|
| CN | 1531721 | A * | 9/2004 | | H03H 9/02149 |
| CN | 101409536 | A * | 4/2009 | | H03H 9/562 |

(Continued)

OTHER PUBLICATIONS

Office Action for TW Application No. 110140255, dated Mar. 17, 2023, 7 pages.

(Continued)

*Primary Examiner* — Pedro J Cuevas
(74) *Attorney, Agent, or Firm* — Abel Schillinger, LLP

(57) ABSTRACT

Provided is a piezoelectric film capable of sufficiently exhibiting both piezoelectric properties and transparency. A piezoelectric film including, by stacking: a transparent piezoelectric base film made of a fluororesin; and a transparent coating layer having a thickness of 0.20 to 2.5 µm, wherein the transparent coating layer forms an interface with the transparent piezoelectric base film over an entire region overlapping the transparent piezoelectric base film.

9 Claims, 1 Drawing Sheet

(51) Int. Cl.

| | |
|---|---|
| ***C08J 7/044*** | (2020.01) |
| ***H10N 30/01*** | (2023.01) |
| ***H10N 30/30*** | (2023.01) |
| ***H10N 30/857*** | (2023.01) |
| *G06F 3/041* | (2006.01) |

(52) U.S. Cl.
CPC ........... *H10N 30/01* (2023.02); *H10N 30/302* (2023.02); *H10N 30/857* (2023.02); *C08J 2327/16* (2013.01); *G06F 3/041* (2013.01); *G06F 2203/04105* (2013.01)

(58) Field of Classification Search
CPC .......... B32B 2307/412; B32B 2307/20; B32B 2307/7376; B32B 2457/208
See application file for complete search history.

(56) References Cited

U.S. PATENT DOCUMENTS

| | | | | |
|---|---|---|---|---|
| 11,424,402 | B2 * | 8/2022 | Kodani | H10N 30/704 |
| 11,532,246 | B2 * | 12/2022 | Yan | H10K 59/00 |
| 11,999,157 | B2 * | 6/2024 | Toyooka | B32B 27/08 |
| 2013/0249354 | A1 * | 9/2013 | Watanabe | G01B 11/0625 29/25.35 |
| 2014/0102533 | A1 * | 4/2014 | Hosoda | B29C 48/08 524/520 |
| 2015/0015120 | A1 * | 1/2015 | Kaimori | C08J 9/365 428/314.2 |
| 2016/0291729 | A1 | 10/2016 | Schardt et al. | |
| 2017/0218117 | A1 | 8/2017 | Tanimoto et al. | |
| 2018/0030229 | A1 | 2/2018 | Shimosugi | |
| 2020/0303619 | A1 | 9/2020 | Kodani et al. | |
| 2021/0343927 | A1 * | 11/2021 | Nagaoka | H10N 30/079 |
| 2021/0407337 | A1 * | 12/2021 | Yan | G09F 9/301 |
| 2022/0037580 | A1 * | 2/2022 | Nakamura | H10N 30/708 |
| 2023/0025871 | A1 * | 1/2023 | Toyooka | C09D 5/006 |
| 2023/0422628 | A1 * | 12/2023 | Imaji | H10N 30/857 |
| 2024/0188445 | A1 * | 6/2024 | Imaji | H10N 30/883 |
| 2024/0196750 | A1 * | 6/2024 | Imaji | C08J 7/0423 |
| 2024/0260476 | A1 * | 8/2024 | Miyoshi | H10N 30/88 |
| 2024/0415020 | A1 * | 12/2024 | Imaji | B32B 27/00 |
| 2024/0415022 | A1 * | 12/2024 | Imaji | H10N 30/857 |
| 2025/0318433 | A1 * | 10/2025 | Imaji | H10N 30/857 |
| 2025/0339876 | A1 * | 11/2025 | Imaji | B06B 1/0688 |

FOREIGN PATENT DOCUMENTS

| | | | | | |
|---|---|---|---|---|---|
| CN | 106575699 | A | | 4/2017 | |
| CN | 207516966 | U | | 6/2018 | |
| CN | 108886090 | A | * | 11/2018 | B32B 27/30 |
| CN | 109196673 | A | | 1/2019 | |
| CN | 109219895 | A | | 1/2019 | |
| CN | 119138127 | A | * | 12/2024 | H10N 30/704 |
| DE | 10296795 | T5 | * | 4/2004 | H03H 9/02149 |
| EP | 3442041 | A1 | * | 2/2019 | B32B 27/30 |
| EP | 4324641 | A1 | | 2/2024 | |
| JP | H08125245 | A | * | 5/1996 | H01L 41/09 |
| JP | H1029303 | A | * | 2/1998 | B41J 2/045 |
| JP | 2007-238754 | A | | 9/2007 | |
| JP | 2010-108490 | A | | 5/2010 | |
| JP | 2010-211482 | A | | 9/2010 | |
| JP | 2017-503241 | A | | 1/2017 | |
| JP | 2017-215960 | A | | 12/2017 | |
| JP | WO2017170616 | A1 | * | 10/2018 | B32B 27/30 |
| JP | 2019-067908 | A | | 4/2019 | |
| KR | 20200089257 | A | | 7/2020 | |
| KR | 102165975 | B1 | * | 10/2020 | H10N 30/302 |
| WO | 2015/053346 | A1 | | 4/2015 | |
| WO | WO-2017170616 | A1 | * | 10/2017 | B32B 27/30 |
| WO | 2022220144 | A1 | | 10/2022 | |
| WO | WO-2023219090 | A1 | * | 11/2023 | H10N 30/704 |

OTHER PUBLICATIONS

English translation of the Office Action for TW Application No. 110140255, dated Mar. 17, 2023, 5 pages.
English translation of the International Preliminary Report on Patentability for PCT/JP2021/038367, dated May 11, 2023, 7 pages.
Office Action for JP2022-559018, dated Dec. 5, 2023, 2 pages.
English translation of the Office Action for JP2022-559018, dated Dec. 5, 2023, 7 pages.
Office Action for CN202180067153.6, dated Oct. 25, 2025, 5 pages.
English translation of Office Action for CN202180067153.6, dated Oct. 25, 2025, 8 pages.
Office Action for CN202180067153.6, dated Dec. 19, 2024, 8 pages.
English translation of Office Action for CN202180067153.6, dated Dec. 19, 2024, 9 pages.
Office Action for CN202180067153.6, dated Jul. 2, 2025, 7 pages.
English translation of Office Action for CN202180067153.6, dated Jul. 2, 2025, 8 pages.
Extended European Search Report for EP21885947.8, dated Mar. 12, 2024, 11 pages.
Office Action for KR1020237013770, dated Jul. 26, 2024, 6 pages.
English translation of Office Action for KR1020237013770, dated Jul. 26, 2024, 8 pages.

* cited by examiner

PIEZOELECTRIC FILM, TOUCH PANEL, AND PIEZOELECTRIC FILM MANUFACTURING METHOD

TECHNICAL FIELD

The present invention relates to a piezoelectric film, a touch panel, and a piezoelectric film manufacturing method.

BACKGROUND ART

A piezoelectric film generates electricity according to pressure so that a position at which pressure is applied can be identified according to the configuration. Accordingly, a piezoelectric film can be used for a pressure-sensitive sensor of a touch panel.

As such a piezoelectric film, a sheet-like transparent piezoelectric layer containing a vinylidene fluoride-tetrafluoroethylene copolymer is known (e.g., refer to Patent Document 1).

It is known that the piezoelectric film is produced by subjecting a resin film containing a vinylidene fluoride resin as a main component to stretching and polarization treatment. In this case, it is known that the resin film is protected from scratches caused by contact between the resin film and a rough surface of a stretching roll when the resin film is stretched in the stretching step, by placing a protective film on the contact surface between the resin film and the stretching roll (refer to, for example, Patent Document 2).

In addition, it is known that when the piezoelectric film has a configuration in which a coating layer having piezoelectric properties is stacked on a base film, the total light transmittance and haze are improved as compared a known piezoelectric film in which a piezoelectric layer is a single film (e.g., refer to Patent Document 3).

CITATION LIST

Patent Literature

Patent Document 1: JP 2010-108490 A
Patent Document 2: JP 2019-67908 A
Patent Document 3: JP 2017-215960 A

SUMMARY OF INVENTION

Technical Problem

A piezoelectric film used in applications such as a touch panel preferably has high transparency, and is required to have such high transparency. In addition, to use the piezoelectric film as a pressure-sensitive sensor, the piezoelectric film is required to exhibit sufficient piezoelectric characteristics in addition to high transparency.

It is an object of one aspect of the present invention to provide a piezoelectric film capable of exhibiting both sufficient piezoelectric properties and sufficient transparency.

Solution to Problem

In order to solve the above problems, a piezoelectric film according to one aspect of the present invention includes, by stacking, a transparent piezoelectric base film made of a fluororesin and a transparent coating layer having a thickness of 0.20 to 2.5 μm, wherein the transparent coating layer forms an interface with the transparent piezoelectric base film over an entire region overlapping the transparent piezoelectric base film.

In order to solve the above problems, a touch panel according to an aspect of the present invention includes the above piezoelectric film.

In order to solve the above problems, a piezoelectric film manufacturing method according to an aspect of the present invention includes a step of forming a transparent coating layer having a thickness of 0.20 to 2.5 μm on at least one surface of a transparent piezoelectric base film made of a fluororesin, wherein the step of forming the transparent coating layer includes a step of applying a coating material for producing the transparent coating layer to at least one surface of the transparent piezoelectric base film and a step of solidifying the coating film formed in the applying step.

Advantageous Effects of Invention

According to one aspect of the present invention, a piezoelectric film capable of exhibiting both sufficient piezoelectric properties and sufficient transparency can be provided.

DESCRIPTION OF EMBODIMENTS

Configuration

Figure 1:
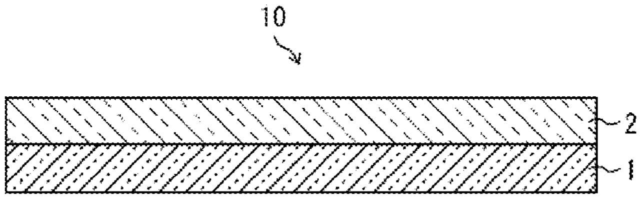
FIG. 1 is a diagram schematically illustrating a layer configuration of a piezoelectric film according to an embodiment of the present invention.

A transparent piezoelectric laminated film (hereinafter, referred to as a "piezoelectric film") according to one embodiment of the present invention includes, by stacking, a transparent piezoelectric film (hereinafter, referred to as a "transparent piezoelectric base film") and a transparent coating layer having a thickness of 0.20 to 2.5 μm. In the present embodiment, the word "to" represents a range including numerical values at both ends.

Transparent Piezoelectric Base Film

The transparent piezoelectric base film in the present embodiment is made of a fluororesin. In the present embodiment, the phrase "made of a fluororesin" means that a fluororesin is the main component in the composition constituting the transparent piezoelectric base film, and "fluororesin is the main component" means that fluororesin is the largest component in the resin component in the composition. The content of the fluororesin in the composition may be 51 mass % or more, 80 mass % or more, or 100 mass %.

The term "piezoelectric base film" means a base film having piezoelectric properties to which a transparent coating layer is not applied. In addition, in the present embodiment, the term "transparent" means an optical characteristic of transmitting visible light at a desired ratio or higher according to the application of the piezoelectric film.

The fluororesin in the present embodiment may be any fluororesin that can be used in a piezoelectric film, and may be one kind of fluororesin or multiple kinds of fluororesin.

Examples of the fluororesin include a vinylidene fluoride resin, a tetrafluoroethylene resin, and a mixture thereof.

Examples of the vinylidene fluoride resin include a homopolymer of vinylidene fluoride and a copolymer thereof. The content of the structural unit derived from a monomer other than vinylidene fluoride in the copolymer of vinylidene fluoride may be appropriately determined within a range in which characteristics specific to the application of the piezoelectric film can be obtained.

Examples of monomers other than vinylidene fluoride in the copolymer of vinylidene fluoride include hydrocarbon monomers and fluorine compounds. Examples of the hydrocarbon monomer include ethylene and propylene. The fluorine compound is a fluorine compound other than vinylidene fluoride and a fluorine compound having a polymerizable structure. Examples of the fluorine compound include vinyl fluoride, trifluoroethylene, trifluorochloroethylene, tetrafluoroethylene, hexafluoropropylene, and fluoroalkyl vinyl ethers.

Examples of the tetrafluoroethylene resin include a homopolymer of tetrafluoroethylene and a copolymer thereof. Examples of the monomer other than tetrafluoroethylene constituting the structural unit of the copolymer include ethylene, fluoropropylene, fluoroalkyl vinyl ether, perfluoroalkyl vinyl ether, and perfluorodioxysol.

In a case where the fluororesin in the present embodiment is a copolymer, the content of the structural unit derived from vinylidene fluoride in the fluororesin can be appropriately set within a range in which the effects of the present embodiment can be achieved. From this viewpoint, the content is preferably 20 mass % or more, more preferably 40 mass % or more, and still more preferably 60 mass % or more.

The transparent piezoelectric base film in the present embodiment may contain various additives as long as the effect of the present embodiment can be achieved. The additive may be one kind of additive or multiple kinds of additives, and examples thereof include a plasticizer, a lubricant, a crosslinking agent, a UV absorber, a pH controlling agent, a stabilizer, an antioxidant, a surfactant, and a pigment.

The thickness of the transparent piezoelectric base film in the present embodiment can be appropriately set from a range in which the effects of the present embodiment can be achieved according to the application of the piezoelectric film. When the thickness of the transparent piezoelectric base film is too thin, the mechanical strength of the film may be insufficient, and when the thickness of the film is too thick, the effect of the film may plateau or the transparency may be insufficient, and it may be difficult to use the transparent piezoelectric base film in optical applications.

The thickness of the transparent piezoelectric base film is preferably 5 μm or more, more preferably 20 μm or more, and still more preferably 30 μm or more from the viewpoint of achieving sufficient piezoelectric properties and mechanical strength. Furthermore, the thickness of the transparent piezoelectric base film is preferably 100 μm or less, more preferably 80 μm or less, and still more preferably 60 μm or less from the viewpoint of achieving sufficient transparency and piezoelectric properties.

The piezoelectric characteristics of the transparent piezoelectric base film in the present embodiment can be appropriately set from a range in which the effect of the present embodiment can be achieved, according to the use of the piezoelectric film. If the piezoelectric characteristics are too low, functionality as a piezoelectric material may be insufficient. From the viewpoint of achieving sufficient piezoelectric characteristics, when the piezoelectric film is a touch panel, for example, the piezoelectric characteristics of the transparent piezoelectric base film have a piezoelectric constant $d_{33}$ of preferably 8.0 pC/N or more, more preferably 10.0 pC/N or more, and even more preferably 12.0 pC/N or more. The upper limit of the piezoelectric characteristics is not limited, but in the above case, the piezoelectric characteristics of the transparent piezoelectric base film may be 30.0 pC/N or less at a piezoelectric constant $d_{33}$ from the viewpoint of sufficiently obtaining the desired effect. The piezoelectric constant $d_{33}$ of the transparent piezoelectric base film defined in the present specification refers to the piezoelectric constant $d_{33}$ in the thickness direction of the transparent piezoelectric base film.

The piezoelectric constant $d_{33}$ of the transparent piezoelectric base film can be adjusted to the above-described range by adjusting the direction and orientation of the electric dipole in the fluororesin in the film. The direction and orientation of the electric dipole can be adjusted by adjusting the degree of polarization treatment and the ratio between an α-crystal and a β-crystal in the crystal of the fluororesin in the transparent piezoelectric base film and. The ratio of the α-crystal and the β-crystal in the crystal and the degree of polarization treatment can be adjusted by adjusting the stretching and poling conditions of the fluororesin film, respectively.

The transparent piezoelectric base film in the present embodiment can be produced by, for example, subjecting a fluororesin sheet as described in Examples to stretching and polarization treatment. In the production, sufficiently thinning the transparent piezoelectric base film to achieve the above-described thickness is preferable from the viewpoint of enhancing the transparency of the transparent piezoelectric base film. In addition, when roll stretching is performed in the production, it is preferable to use a mirror-finished roll or to use a protective film (e.g., refer to JP 2019-67908 A) from the viewpoint of preventing scratches on the surface of the transparent piezoelectric base film and enhancing the transparency of the transparent piezoelectric base film.

Transparent Coating Layer

The transparent coating layer in the present embodiment need only be a layer that is transparent and that can sufficiently exhibit the piezoelectric characteristics of the transparent piezoelectric base film in the piezoelectric film.

The transparent coating layer may be disposed on only one surface side or on both surface sides of the transparent piezoelectric base film. In particular, the transparent coating layer is preferably disposed on both surfaces of the transparent piezoelectric base film because a higher haze reduction effect is obtained. When the transparent coating layer is formed on both surfaces of the transparent piezoelectric base film, the two transparent coating layers may have the same composition, thickness, and physical properties, or may have different compositions, thicknesses, and physical properties. When the transparent coating layer is formed on both surfaces of the transparent piezoelectric base film, it is preferable that at least one of the transparent coating layers, more preferably both of the transparent coating layers, have a preferable configuration for the transparent coating layer to be described below.

The transparent coating layer forms an interface with the transparent piezoelectric base film over the entire region overlapping the transparent piezoelectric base film. Arranging the transparent coating layer in the thickness direction with respect to the transparent piezoelectric base film in this manner is preferable from the viewpoint of reducing the haze of the transparent piezoelectric base film. The phrase "forming an interface" means that two objects are in direct contact with each other without another object present therebetween. That is, the phrase "the transparent coating layer forms an interface with the transparent piezoelectric base film" refers to a state in which the transparent coating layer is in direct contact with the transparent piezoelectric base film without another object such as air present therebetween. When the transparent piezoelectric base film has fine irregularities on the surface, the transparent coating layer is in contact with the transparent piezoelectric base film so as to follow the surface shape of the transparent piezoelectric base film.

In the piezoelectric film of the present embodiment, the transparent coating layer forms an interface with the transparent piezoelectric base film over the entire region overlapping the transparent piezoelectric base film. The "region overlapping the transparent piezoelectric base film" may be a region in which the transparent piezoelectric base film and the transparent coating layer need to overlap each other depending on the application of the piezoelectric film. Of course, the transparent coating layer and the transparent piezoelectric base film may completely overlap each other in the planar direction.

An aspect in which the transparent coating layer forms an interface with the transparent piezoelectric base film in the thickness direction of the piezoelectric film may be, for example, an aspect in which the surface of the transparent piezoelectric base film is coated with the transparent coating layer.

When the transparent coating layer in the present embodiment is too thin, the transparent coating layer may not be able to sufficiently cover the fine uneven shape on the surface of the transparent piezoelectric base film, and the effect of reducing the haze of the transparent piezoelectric base film may not be sufficiently achieved. If the transparent coating layer is too thick, the piezoelectric properties of the piezoelectric film may be insufficient. Therefore, the thickness of the transparent coating layer is preferably 0.20 μm or more, more preferably 0.35 μm or more, and even more preferably 0.50 μm or more from the viewpoint of reducing the haze of the transparent piezoelectric base film. In addition, the thickness of the transparent coating layer is preferably 3.5 μm or less, more preferably 2.5 μm or less, and even more preferably 1.5 μm or less, from the viewpoint of sufficiently reflecting the piezoelectric characteristics of the transparent piezoelectric base film, and obtaining a piezoelectric film capable of sufficiently exhibiting the piezoelectric characteristics of the transparent piezoelectric base film. When the thickness of the transparent coating layer is in the above-described range, it is possible to achieve both sufficient piezoelectric properties and transparency suited to the application of the piezoelectric film.

In the present embodiment, the thickness of the transparent coating layer means the thickness of one transparent coating layer. When the transparent coating layer is disposed on both surfaces of the transparent piezoelectric base film, the thickness of the transparent coating layer need only be a value that can sufficiently reflect the influence of the transparent coating layer on the piezoelectric film. For example, the value may be the thickness of the thicker transparent coating layer of the two transparent coating layers, or the value may be the average value of both thicknesses. When the transparent coating layer is formed on both surfaces, each transparent coating layer may independently have a thickness in the above-described range, and may have substantially the same thickness or substantially different thicknesses.

The surface of the transparent coating layer in the present embodiment is preferably smooth from the viewpoint of enhancing transparency. The surface of the transparent coating layer refers to a surface of the transparent coating layer that is not in contact with the transparent piezoelectric base film. When a plurality of the transparent coating layers are stacked, the surface of the transparent coating layer refers to the surface of the outermost transparent coating layer that is not in contact with another transparent coating layer. In a case where the transparent coating layer is disposed on both surfaces of the transparent piezoelectric base film, both surfaces of the two transparent coating layers are preferably smooth.

From such a viewpoint, in the surface shape of the transparent piezoelectric base film, the maximum height Rz of surface roughness is preferably 0.15 μm or less, more preferably 0.10 μm or less, and even more preferably 0.080 μm or less. The surface shape can be measured by a known technique capable of measuring a surface shape of a resin film, or can be measured by a known technique capable of measuring a surface shape of a specific layer from a cross-section of a laminated film.

The transparent coating layer may be a transparent surface protective layer for scratch prevention, also known as a hard coat layer. The material of the transparent coating layer can be selected from any material that can be used for a piezoelectric film as long as it has transparency and sufficiently exhibits the piezoelectric characteristics of the transparent piezoelectric base film. The material may be an inorganic material or an organic material, and one or more kinds thereof may be used. Further, the material of the coating layer may be the material of the hard coat layer. Examples of the material include a melamine resin, a urethane resin, an alkyd resin, an acrylic resin, and a silicone resin. That is, the transparent coating layer may be made of one or more resins selected from the group consisting of a melamine resin, a urethane resin, an alkyd resin, an acrylic resin, and a silicone resin. When the transparent coating layer is formed on both surfaces of the transparent piezoelectric base film, the two transparent coating layers may have the same composition, or may have different compositions.

It is preferable that the material of the transparent coating layer be an acrylic resin, that is, the transparent coating layer be made of an acrylic resin because acrylic resin has sufficient transparency, a larger number of types of materials can be used, and raw material cost is low. In addition, since the acrylic resin is an ultraviolet-curable resin, acrylic resin is preferable also from the viewpoint of preventing thermal deformation of the transparent piezoelectric base film when forming the transparent coating layer.

Here, "acrylic resin" means a resin composition containing an acrylic resin as a main component. The acrylic resin may be a (meth)acrylic acid ester resin. The term "(meth) acrylic acid" is a generic term for acrylic acid and methacrylic acid, and means one or both of them.

Examples of the (meth)acrylic acid ester resin include a homopolymer of a (meth)acrylic acid ester monomer and a copolymer of a (meth)acrylic acid ester monomer and another monomer. Examples of the (meth)acrylic acid ester monomer include a monofunctional (meth)acrylic acid ester monomer and a polyfunctional (meth)acrylic acid ester monomer. Examples of other monomers include urethane (meth)acrylic acid monomers, epoxy (meth)acrylic acid monomers, and polyester (meth)acrylic acid.

In the description of resin as the material of the transparent coating layer, the term "main component" means that the resin as a main component is the largest component in the resin component. The content of the resin as a main component in the composition may be 51 mass % or more, 80 mass % or more, or 100 mass %.

The transparent coating layer may have various functions within a range in which the effect of the present embodiment is achieved. The material of the transparent coating layer may further contain a material for achieving an optional function as another component. Such materials may be used singularly or in conjunction, examples of which include an optical modifier, an antistatic agent, and an anti-blocking material for controlling the refractive index of the transparent coating layer. Examples of the optical modifier include hollow silica-based fine particles, a silane coupling agent, silicon oxide, aluminum oxide, titanium oxide, zirconium oxide, zinc oxide, and tin oxide. Examples of the antistatic agent include a surfactant, antimony pentoxide, ITO, and a conductive polymer. When the transparent coating layer is formed on both surfaces of the transparent piezoelectric base film, the other component may be contained in only one or both of the transparent coating layers.

In the present embodiment, the anti-blocking material is preferable from the viewpoint of preventing blocking of the piezoelectric film. The anti-blocking material can be appropriately selected from a range in which the transparency of the transparent coating layer can be sufficiently exhibited. For example, it is preferable that the difference between the refractive index of the anti-blocking material and the refractive index of the resin serving as the material of the transparent coating layer be small. Examples of the anti-blocking material include inorganic or organic particulates such as aggregated silica, spherical silica, polymethyl methacrylate (PMMA) beads, and silicone beads. Among these, spherical silica is particularly preferable as an anti-blocking material for a transparent coating layer because it is inexpensive in addition to having anti-blocking properties and transparency. From the viewpoint of preventing blocking of the piezoelectric film, when the transparent coating layer is formed on both surfaces of the transparent piezoelectric base film, the anti-blocking material may be contained in only one or both of the transparent coating layers.

Other Layer Configurations

The piezoelectric film of the present embodiment may further have a configuration other than that described above, as long as the effect of the present embodiment is obtained. Such other configurations may be used singularly or in conjunction, and examples thereof include a transparent adhesive layer for bonding a piezoelectric film to a cover glass or a transparent electrode, a peelable release layer that is in contact with the transparent adhesive layer, an optical adjustment layer (index matching layer), and a conductive layer. The optical adjustment layer can be formed using the material of the transparent coating layer, within a range in which the desired performance is exhibited.

The thickness of each layer constituting the piezoelectric film can be measured by embedding the piezoelectric film in an epoxy resin, cutting the epoxy resin mass to expose a cross-section of the piezoelectric film, and observing the cross-section with a scanning electron microscope. The thickness of the layer may be a representative value of thicknesses of the layer, or may be an average value of a plurality of any measured values, a maximum value of the measured values, or a minimum value of the measured values.

Physical Properties

The piezoelectric film of the present embodiment is preferably sufficiently transparent from the viewpoint of achieving sufficient light transmittance. For example, the total light transmittance of the piezoelectric film can be appropriately set depending on the use of the piezoelectric film. The total light transmittance of the piezoelectric film is preferably 80% or more when the film is used as a pressure-sensitive sensor of a touch panel, and more preferably 83% or more when used as a pressure-sensitive sensor disposed on the surface side of a display in a touch panel. The upper limit of the total light transmittance is not limited, but in the above case, the total light transmittance may be 97% or less from the viewpoint of sufficiently achieving the desired effect. The total light transmittance is a parameter used as an index of a transparent body, and it can be said that the closer to 100% the total light transmittance is, the more transparent the transparent body is. The total light transmittance can be measured by the known method described in JIS K7361-1 using, for example, a haze meter.

Similarly to the total light transmittance, the haze value of the piezoelectric film can be appropriately set depending on the application of the piezoelectric film. The haze value of the piezoelectric film is preferably 2.0 or less when the film is used as a pressure-sensitive sensor of a touch panel, and more preferably 1.0% or less when the film is used as a pressure-sensitive sensor disposed on the front surface side of a display in a touch panel. The lower limit of the haze value is not limited, and in the above case, the haze value need only be 0.1% or more from the viewpoint of sufficiently achieving the desired effect. The haze is the degree of cloudiness, and the haze value of the piezoelectric film represents the degree of transparency of the piezoelectric film. The haze value increases as the degree of cloudiness increases. When the haze value is 0, it is determined that the material is completely transparent. The haze value can be measured by the known method described in JIS K7136 using, for example, a haze meter. The total light transmittance and haze value of the transparent piezoelectric base film are not particularly limited as long as the desired total light transmittance and haze value of the piezoelectric film are obtained.

In the piezoelectric film of the present embodiment, from the viewpoint of sufficiently exhibiting the piezoelectric characteristics of the transparent piezoelectric base film, the piezoelectric constant $d_{33}$ of the piezoelectric film is preferably for example, 8.0 pC/N or more when the film is used as a pressure-sensitive sensor of a touch panel, and from the viewpoint of applying the film to a pressure-sensitive sensor disposed on the surface side of a display in a touch panel, the piezoelectric constant $d_{33}$ is more preferably 10.0 pC/N or more, and even more preferably 12.0 pC/N or more. The upper limit of the piezoelectric constant $d_{33}$ is not limited, but in the above case, the piezoelectric characteristics of the piezoelectric film need only be 30.0 pC/N or less at a piezoelectric constant $d_{33}$ from the viewpoint of sufficiently achieving the desired effect. The piezoelectric constant $d_{33}$ of the piezoelectric film defined herein refers to the piezoelectric constant $d_{33}$ in the thickness direction of the piezoelectric film.

The piezoelectric constant $d_{33}$ can be measured by a known technique as described in the Examples below. The piezoelectric characteristics of the piezoelectric film can be adjusted by changing the thickness of the transparent coating layer in the piezoelectric film or by using a transparent piezoelectric base film having the desired piezoelectric properties. By setting the thickness of the transparent coating layer in the piezoelectric film within the above-described range, the degree of decrease in the piezoelectric constant $d_{33}$ of the transparent piezoelectric base film due to the provision of the transparent coating layer can be suppressed to a low level. Therefore, the piezoelectric constant $d_{33}$ of the piezoelectric film can be set to the above-described range by using a transparent piezoelectric base film having piezoelectric characteristics in the range of 8.0 pC/N or more and 30.0 pC/N or less at the piezoelectric constant $d_{33}$.

Production Method

The piezoelectric film of the present embodiment can be produced in the same manner as a known piezoelectric film, except that the above-described film is used and the above-described layer is formed.

The transparent coating layer in the present embodiment can be produced by performing a step of applying a coating material for forming the transparent coating layer to at least one surface of the transparent piezoelectric base film and a step of solidifying the coating film formed in the applying step. The step of applying the coating material can be performed by a known coating method. Examples of the coating method include spray coating, roll coating, die coating, air knife coating, blade coating, spin coating, reverse coating, gravure coating, and vapor deposition. The thickness of the coating film can be appropriately adjusted based on the number of times the coating film is applied or the viscosity of the coating material.

The step of solidifying can be performed by a known method of solidifying the coating film of the coating material. Examples of the solidification method include drying, and curing by polymerization by heating or light irradiation. Of these methods, curing by polymerization by light irradiation such as ultraviolet (UV) irradiation is preferable from the viewpoint of being a suitable method for processing on the surface of an object and preventing thermal deformation of individual layers. For example, the transparent coating layer can be formed by applying the above coating material, removing the solvent in the coating material by heating, and then curing the coating film by UV irradiation. When the transparent coating layer is formed by UV irradiation, the UV irradiation is preferably performed in an inert atmosphere from the viewpoint of preventing curing inhibition due to oxygen.

The coating material for the transparent coating layer may contain a polymer, may contain a monomer, or may contain both of these. In addition, in the coating material, the polymer may contain a crosslinked structure that causes curing, or may contain a low molecular weight compound having a plurality of crosslinked structures. Further, the coating material may contain, as appropriate and necessary, an additive for solidification, such as a polymerization initiator for causing the polymerization reaction.

Hereinafter, an embodiment of the present invention will be described with reference to the drawings. As illustrated in FIG. 1, a piezoelectric film 10 according to an embodiment of the present invention includes a transparent piezoelectric base film 1 and a transparent coating layer 2 that are directly stacked.

The transparent piezoelectric base film 1 is made of a fluororesin as described above, and may be a film obtained by, for example, subjecting a fluororesin material to stretching and polarization treatment. The transparent coating layer 2 is made of, for example, the above-described acrylic resin, and is directly stacked on one surface of the transparent piezoelectric base film 1.

Figure 2:
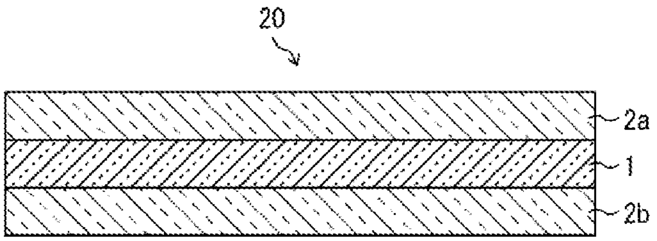
FIG. 2 is a diagram schematically illustrating a layer configuration of a piezoelectric film according to another embodiment of the present invention.

As illustrated in FIG. 2, a piezoelectric film 20 according to another embodiment of the present invention includes the transparent piezoelectric base film 1 and the transparent coating layer 2 that are directly stacked. In the piezoelectric film 20, the transparent coating layer 2 is disposed on both surfaces of the transparent piezoelectric base film 1. That is, a transparent coating layer 2*a* is stacked on one surface of the transparent piezoelectric base film 1, and a transparent coating layer 2*b* is stacked on the other surface of the transparent piezoelectric base film 1.

Touch Panel

Figure 3:
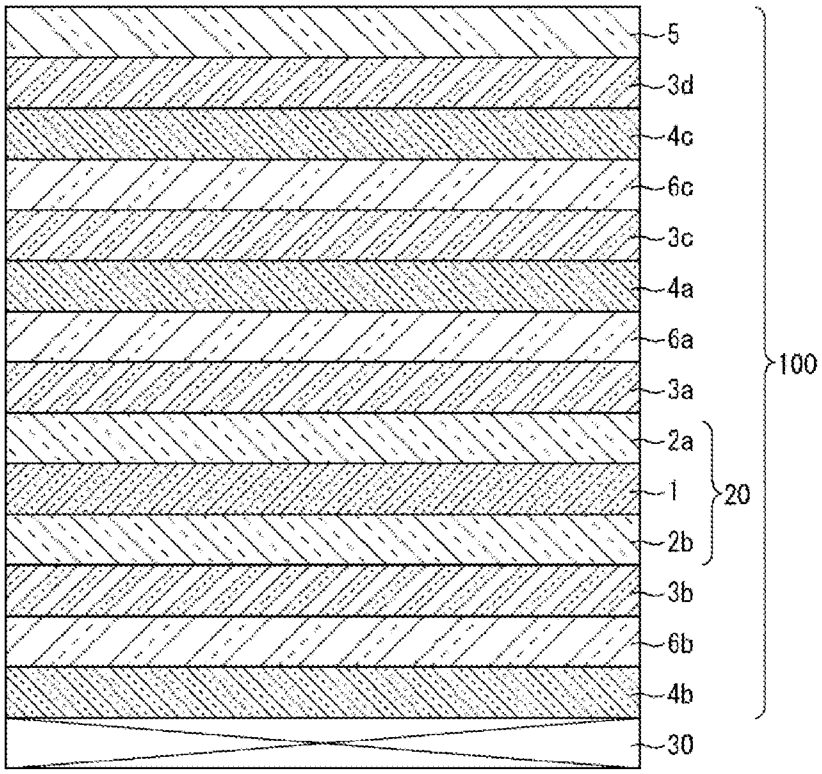
FIG. 3 is a diagram schematically illustrating a layer configuration of a touch panel according to an embodiment of the present invention.

A touch panel according to an embodiment of the present invention includes the above-described piezoelectric film according to an embodiment of the present invention. The location and quantity of the piezoelectric films in the touch panel can be appropriately set according to the intended use or intended function of the touch panel. FIG. 3 is a view schematically illustrating an example of a layer configuration in the touch panel according to the embodiment of the present invention.

As illustrated in FIG. 3, a touch panel 100 has a configuration in which the piezoelectric film 20 illustrated in FIG. 2 is sandwiched between the transparent electrode 4*b* and the cover glass 5. Between the piezoelectric film 20 and the cover glass 5, a transparent adhesive layer 3*a*, a transparent substrate 6*a*, a transparent electrode 4*a*, a transparent adhesive layer 3*c*, a transparent substrate 6*c*, a transparent electrode 4*c*, and a transparent adhesive layer 3*d* are stacked in this orderfrom the piezoelectric film 20 toward the cover glass 5. Between the piezoelectric film 20 and the transparent electrode 4*b*, a transparent adhesive layer 3*b* and a transparent substrate 6*b* are disposed from the piezoelectric film 20 toward the transparent electrode 4*b*. As described above, the touch panel 100 is configured by stacking the transparent electrode 4*b*, the piezoelectric film 20, and the cover glass 5 in this order. When the touch panel 100 is put into practical use, the surface of the touch panel 100 on the side of the transparent electrode 4*b* can be disposed overlapping the surface of the display 30, but no limitation is intended.

The piezoelectric film 20 and the cover glass 5 are bonded to each other by the transparent adhesive layer 3*a* with the transparent adhesive layers 3*c* and 3*d*, the transparent electrodes 4*a* and 4*c*, and the transparent substrates 6*a* and 6*c* interposed therebetween, and the piezoelectric film 20 and the transparent electrode 4*b* are bonded to each other by the transparent adhesive layer 3*b* with the transparent substrate 6*b* interposed therebetween. In addition, a display panel such as an organic EL display panel or a liquid crystal display panel, that is, the display 30 may be disposed on the opposite side of the piezoelectric film 20 in the stacking direction of the transparent electrode 4*b*. Since a known display panel in the related art can be employed as the display 30, a detailed description of the configuration of the display 30 will be omitted in the present specification.

The transparent electrodes 4*a*, 4*b*, and 4*c* may be formed on the transparent substrates 6*a*, 6*b*, and 6*c*, respectively, and bonded to desired layers in the touch panel 100 together with the transparent substrates 6*a*, 6*b*, and 6*c*. Alternatively, the transparent electrodes 4*a*, 4*b*, and 4*c* may be formed directly on the surfaces of other adjacent layers in the stacking direction and bonded by the transparent adhesive layers 3*a*, 3*b*, 3*c*, or 3*d*.

As the transparent electrodes 4*a*, 4*b*, and 4*c*, known transparent electrodes that can be used in a touch panel can be employed. More specifically, the transparent electrodes 4*a*, 4*b*, and 4*c* may be substantially transparent planar electrodes, may be conductive thin films having a pattern, or may have a planar structure formed of an extremely thin conductive wire. The material constituting the transparent electrodes 4*a*, 4*b*, and 4*c* is not limited, and metal oxides of at least one metal selected from the group consisting of In, Sn, Zn, Ga, Sb, Ti, Si, Zr, Mg, Al, Au, Ag, Cu, Pd, and W are preferably used. The metal oxide may further contain a metal atom selected from the group described above, if necessary. As the metal oxide, an oxide such as indium-tin composite oxide (ITO) or antimony-tin composite oxide (ATO) is preferably used, and ITO is particularly preferably used. Examples of other representative materials for the transparent electrodes 4*a*, 4*b*, and 4*c* include silver nanowire, silver mesh, copper mesh, graphene, and carbon nanotube. For the transparent substrates 6*a*, 6*b*, and 6*c*, a known transparent film that can be used as a base for supporting the transparent electrodes 4*a*, 4*b*, and 4*c* can be employed. The material forming the transparent substrates 6*a*, 6*b*, and 6*c* is not limited, and polyethylene terephthalate (PET), polycarbonate (PC) and a cycloolefin polymer (COP) are preferably used.

The cover glass 5 is a cover glass for a touch panel. The cover glass need only be a sheet-like light transmitting member for a touch panel, and may be a glass plate such as the cover glass 5 or a transparent resin sheet.

The touch panel in the embodiment of the present invention may further include other components, as long as the effects of the present embodiment can be achieved.

In addition, the touch panel according to the embodiment of the present invention may include the piezoelectric film in the embodiment according to the present invention in the laminated structure. The position of the piezoelectric film in the touch panel in the stacking direction may be appropriately set within a range in which the effect of the embodiment according to the present invention can be achieved.

In addition, the touch panel according to the embodiment of the present invention may have a configuration in which the piezoelectric film according to the present embodiment is appropriately added to a laminated structure in a known touch panel, such as a GFF type panel or a GF2 type panel. In this case, a transparent electrode layer used for detecting pressure and a position sensor used for detecting a position may be directly stacked on the piezoelectric film of the present embodiment, or may be bonded thereto via an adhesive layer. The touch panel having such a configuration can further exhibit a function derived from the piezoelectric film in addition to the functions of a known touch panel. For example, the touch panel can include both a position sensor and a pressure sensor in a transparent laminated structure.

In the production of the touch panel of the present embodiment, the transparent adhesive layer may be formed not only on the transparent coating layer but also on another layer that adheres to the transparent coating layer via the transparent adhesive layer. In this case, the transparent adhesive layer may or may not be present on the transparent coating layer side.

Effect

As described above, the piezoelectric film according to the embodiment of the present invention may include the transparent piezoelectric base film made of a fluororesin, and the transparent coating layer. The piezoelectric film having the above-described configuration can achieve sufficient piezoelectric characteristics by the transparent piezoelectric base film, and can exhibit higher transparency because the haze of the transparent piezoelectric base film is reduced.

With respect to transparency, by providing a transparent coating layer on the transparent piezoelectric base film, the effect of reducing haze in the piezoelectric film is obtained, and as a result, the transparency of the piezoelectric film is enhanced. It is thought that one of the factors of lowering the transparency of the transparent piezoelectric base film is a fine uneven shape such as scratches on the surface of the transparent piezoelectric base film. It is thought that when this fine uneven shape is filled with the transparent coating layer, light scattering due to the uneven shape is suppressed, which provides the effect of reducing haze in the piezoelectric film.

Since the piezoelectric film provides sufficient piezoelectric characteristics and higher transparency as described above and can be formed only of an organic layer such as a resin, the overall layer thickness of the pressure-sensitive sensor having sufficient piezoelectric characteristics and transparency can be further reduced. Therefore, the piezoelectric film can be disposed as a pressure-sensitive sensor on the surface (image display surface) side of the display panel. Therefore, the layer configuration of the touch panel can be simplified over that in the related art, or the overall layer thickness of the touch panel can be reduced, and the degree of freedom in terms of the quantity and location of piezoelectric films to be arranged in the touch panel can be increased.

SUMMARY

As is clear from the above description, the piezoelectric film of the embodiment of the present invention includes, by stacking, a transparent piezoelectric base film made of a fluororesin and a transparent coating layer having a thickness of 0.20 to 2.5 μm, wherein the transparent coating layer forms an interface with the transparent piezoelectric base film over an entire region overlapping the transparent piezoelectric base film. In addition, the touch panel according to the embodiment of the present invention includes the piezoelectric film. Therefore, the piezoelectric film can achieve both sufficient piezoelectric properties and sufficient transparency.

In an embodiment of the present invention, it is preferable that the piezoelectric film have a haze of 2.0% or less. In this case, the piezoelectric film has sufficient transparency for use as a pressure-sensitive sensor of a touch panel.

In addition, in the embodiment of the present invention, it is preferable that the piezoelectric constant $d_{33}$ be 8.0 to 30.0 pC/N. In this case, the piezoelectric film has sufficient piezoelectric characteristics for use as a pressure-sensitive sensor in a touch panel.

In an embodiment of the present invention, it is preferable that the piezoelectric film have a total light transmittance of 80% or more. In this case, the piezoelectric film has sufficient transparency for use as a pressure-sensitive sensor in a touch panel.

In the embodiment of the present invention, the maximum height Rz of surface roughness of the surface of the transparent coating layer is 0.10 μm or less, which is more effective from the viewpoint of reducing the haze of the transparent piezoelectric base film and achieving sufficient transparency of the piezoelectric film.

In the embodiment of the present invention, the thickness of the transparent piezoelectric base film is 20 to 100 μm, which is more effective from the viewpoint of exhibiting both sufficient piezoelectric properties and sufficient transparency of the transparent piezoelectric base film.

In the embodiment of the present invention, the transparent coating layer is stacked on both surfaces of the transparent piezoelectric base film, which is more effective from the viewpoint of reducing haze of the transparent piezoelectric base film and achieving sufficient transparency of the piezoelectric film.

A piezoelectric film manufacturing method according to an embodiment of the present invention includes a step of forming a transparent coating layer having a thickness of 0.20 to 2.5 μm on at least one surface of a transparent piezoelectric base film made of a fluororesin, wherein the step of forming the transparent coating layer includes a step of applying a coating material for producing the transparent coating layer to at least one surface of the transparent piezoelectric base film and a step of solidifying the coating film formed in the applying step. Therefore, it is possible to manufacture a piezoelectric film capable of achieving both sufficient piezoelectric properties and sufficient transparency.

The present invention is not limited to each embodiment described above, and may be variously altered within the scope indicated in the claims. Embodiments obtained by appropriately combining technical means disclosed in different embodiments are also included in the technical scope of the present invention.

EXAMPLES

Example 1

A resin film (thickness, 140 μm) molded from polyvinylidene fluoride (manufactured by KUREHA CORPORATION) having an inherent viscosity of 1.1 dl/g was passed through a preheating roll heated to a surface temperature of 110° C. Subsequently, the film having passed through the preheating roll was passed through a stretching roll heated to a surface temperature of 120° C., and stretched so that the stretching ratio was 4.2 times. After stretching, the film was subjected to a polarization treatment by being passed through polarization rolls to obtain a film having piezoelectric properties. The DC voltage was increased from 0 kV to 11.8 kV. The film after the polarization treatment was further heat-treated at 130° C. for 1 minute to obtain a transparent piezoelectric base film having a thickness of 40 μm.

A hard coating agent ("BS CH271", manufactured by Arakawa Chemical Industries, Ltd.) was applied to one surface of the transparent piezoelectric base film with a bar coater and dried at 80° C. for 2 minutes. The hard coating agent "BS CH271" is hereinafter referred to as "HC agent (1)".

Next, the dried coating film of the hard coating agent was irradiated with UV at an integrated light amount of 400 $mJ/cm^2$ using the UV irradiation device CSOT-40 (available from GS Yuasa Corporation). Thus, a piezoelectric film having a transparent coating layer A with the thickness shown in the table below on one side was obtained. The same operation was performed on the opposite surface of the transparent piezoelectric base film to form a transparent coating layer B having the thickness shown the following table, thereby obtaining a piezoelectric film in which the transparent coating layer was present on both surfaces of the transparent piezoelectric base film.

Examples 2 to 4

Piezoelectric films in which the transparent coating layer has different thicknesses were obtained in the same manner as in Example 1 except that the transparent coating layers were formed so as to have thicknesses shown the table described below.

Example 5

A piezoelectric film was obtained in the same manner as in Example 1 except that the DC voltage in the polarization treatment of the polyvinylidene fluoride resin film was changed to 12.0 kV, the hard coating agent was changed to "TYAB-M101" (manufactured by TOYOCHEM CO., LTD.), and the transparent coating layers were formed so as to have the thicknesses shown in the following table. The hard coating agent "TYAB-M101" is hereinafter referred to as "HC agent (2)".

Example 6

A piezoelectric film was obtained in the same manner as in Example 5 except that the transparent coating layer was formed only on one surface so as to have the thickness shown in the table described below.

Example 7

A piezoelectric film was obtained in the same manner as in Example 1 except that the hard coating agent for the transparent coating layer B was changed to "BS-575CB" (manufactured by Arakawa Chemical Industries, Ltd.) and the transparent coating layer was formed so as to have the thickness shown in the table described below. The hard coating agent "BS-575CB" is hereinafter referred to as "HC agent (3)".

Example 8

A piezoelectric film in which the transparent coating layers have different thicknesses was obtained in the same manner as in Example 7 except that the transparent coating layers were formed so as to have the thicknesses shown in the table described below.

Example 9

A piezoelectric film was obtained in the same manner as in Example 1 except that the DC voltage in the polarization treatment of the polyvinylidene fluoride resin film was changed to 11.0 kV, and the transparent coating layers were formed so as to have the thicknesses shown in the following table.

Comparative Example 1

The transparent piezoelectric base film obtained in Example 1 was used as a piezoelectric film as a comparative example.

Comparative Example 2

A piezoelectric film as a comparative example was obtained in the same manner as in Example 9 except that the transparent coating layers were formed so as to have the thicknesses shown in the table described below.

Comparative Example 3

A piezoelectric film as a comparative example was obtained in the same manner as in Example 5 except that the transparent coating layers were formed so as to have the thicknesses shown in the table described below.

Evaluation

Thickness of Transparent Coating Layer

Each of the piezoelectric films of the Examples and Comparative Examples 2 and 3 was embedded in an epoxy resin, and the epoxy resin mass was cut so that a cross-section of the piezoelectric film was exposed. The exposed cross-section of the piezoelectric film was observed using a scanning electron microscope ("SU3800", available from Hitachi High-Technologies Corporation) under the conditions of an acceleration voltage of 3.0 kV and a magnification of 50,000 times to measure the thickness of the transparent coating layer in the piezoelectric film.

In the measurement of the thickness of the transparent coating layer, the thicknesses at two portions of the transparent coating layer were measured, and the average value thereof was defined as the thickness of the transparent coating layer. Under the above observation conditions, the interface of the transparent coating layer was observed as substantially smooth lines, and the distance between the lines was measured in the measurement of the thickness of the transparent coating layer.

Total Light Transmittance

The total light transmittance of each of the piezoelectric films used in the Examples and Comparative Examples was measured using a haze meter ("NDH7700SP II", available from Nippon Denshoku Industries Co., Ltd.) based on the method described in JIS K7361-1. When the total light transmittance is 80% or more, it can be determined that there are no problems in practical use of the touch panel.

Haze Value

The haze value of each of the piezoelectric films used in the Examples and Comparative Examples was measured using a haze meter ("NDH7700SP II", available from Nippon Denshoku Industries Co., Ltd.) based on the method described in JIS K7136. When the haze value is 2.0% or less, it can be determined that there are no problems in practical use of the touch panel.

L* Value, a* Value, b* Value

An L* value, an a* value, and a b* value in a L*a*b* color system of each of the piezoelectric films used in the Examples and Comparative Examples were measured using a spectrocolorimeter ("SE7700", available from Nippon Denshoku Industries Co., Ltd.) in accordance with the method described in JIS K8722. When the L* value is 85 or more, it can be determined that there are no problems in practical use of the touch panel. When the a* value is 3 or less, it can be determined that there are no problems in practical use of the touch panel. When the b* value is 4 or less, it can be determined that there are no problems in practical use of the touch panel.

Piezoelectric Constant $d_{33}$ Value

The piezoelectric constant $d_{33}$ of each of the piezoelectric films of the Examples and Comparative Examples was measured by using a piezoelectric constant measuring device ("Piezometer System PM300", manufactured by Piezotest Pte Ltd) by clipping a sample at 0.2 N and reading the generated charge when a force of 0.15 N and 110 Hz was applied. Although the measured value of the piezoelectric constant $d_{33}$ is a positive value or a negative value depending on whether the front or back of the film is to be measured, the absolute value is described herein. When the piezoelectric constant $d_{33}$ value is 8.0 pC/N or more, it can be determined that there are no problems in practical use of the touch panel.

Surface Roughness Ra

An arithmetic mean roughness (surface roughness) Ra of the surface of the transparent coating layer of each of the piezoelectric films of the Examples and Comparative Examples was measured by a method in accordance with JIS B 0601-2013 using a surface roughness measuring instrument ("SURFCOM 1500", manufactured by TOKYO SEIMITSU CO., LTD.). The arithmetic average roughness (surface roughness) Ra was measured in the width direction (TD direction) of the piezoelectric film at any ten points in one transparent coating layer, and the average value of the measured values was obtained as the Ra of the transparent coating layer. In Comparative Example 1, the Ra of the surface of the transparent piezoelectric base film was measured. In Examples 7 and 8, the Ra of the transparent coating layer formed from the HC agent (3) was measured.

Maximum Height Rz

Similar to the surface roughness Ra, a maximum height Rz of the surface of the transparent coating layer of each of the piezoelectric films of the Examples and Comparative Examples was measured by a method in accordance with JIS B 0601-2013 using a surface roughness measuring instrument ("SURFCOM 1500", manufactured by TOKYO SEIMITSU CO., LTD.). As for the maximum height Rz, similar to the arithmetic average roughness (surface roughness) Ra, the maximum height Rz was measured in the width direction (TD direction) of the piezoelectric film at any ten points in one transparent coating layer, and the average value of the measured values was obtained as the Rz of the transparent coating layer. In Comparative Example 1, the Rz of the surface of the transparent piezoelectric base film was measured. In Examples 7 and 8, the Rz of the transparent coating layer formed from the HC agent (3) was measured.

TABLE 1

| | Transparent piezoelectric base film | Transparent coating layer A | | Transparent coating layer B | | Optical characteristics | | | | | Piezoelectric constant | Surface roughness | |
|---|---|---|---|---|---|---|---|---|---|---|---|---|---|
| | Thickness (μm) | Thickness (μm) | Type | Thickness (μm) | Type | Total light transmittance (%) | Haze (%) | L* (—) | a* (—) | b* (—) | $d_{33}$ (pC/N) | Ra (μm) | Rz (μm) |
| Example 1 | 40 | 0.42 | HC agent (1) | 0.40 | HC agent (1) | 91.7 | 0.6 | 96.6 | 0.3 | 0.2 | 17.0 | 0.013 | 0.080 |
| Example 2 | 40 | 0.65 | HC agent (1) | 0.65 | HC agent (1) | 91.7 | 0.5 | 96.7 | 0.1 | 0.3 | 16.5 | 0.009 | 0.057 |
| Example 3 | 40 | 0.97 | HC agent (1) | 0.92 | HC agent (1) | 91.9 | 0.5 | 96.8 | −0.1 | 0.4 | 16.4 | 0.008 | 0.053 |
| Example 4 | 40 | 1.9 | HC agent (1) | 2.1 | HC agent (1) | 91.8 | 0.5 | 96.8 | 0.0 | 0.5 | 14.6 | 0.008 | 0.054 |
| Example 5 | 40 | 1.1 | HC agent (2) | 1.0 | HC agent (2) | 91.5 | 0.7 | 96.5 | 0.0 | 0.5 | 18.6 | 0.009 | 0.053 |
| Example 6 | 40 | 1.0 | HC agent (2) | — | — | 92.6 | 1.7 | 96.5 | 0.1 | 0.7 | 20.8 | 0.009 | 0.053 |
| Example | 40 | 0.40 | HC agent | 0.41 | HC agent | 91.9 | 0.3 | 96.8 | 0.2 | 0.5 | 14.2 | 0.005 | 0.036 |

TABLE 1-continued

| | Transparent piezoelectric base film Thickness (μm) | Transparent coating layer A Thickness (μm) | Transparent coating layer A Type | Transparent coating layer B Thickness (μm) | Transparent coating layer B Type | Optical characteristics Total light transmittance (%) | Haze (%) | L* (—) | a* (—) | b* (—) | Piezoelectric constant $d_{33}$ (pC/N) | Surface roughness Ra (μm) | Rz (μm) |
|---|---|---|---|---|---|---|---|---|---|---|---|---|---|
| 7 | | | (1) | | (3) | | | | | | | | |
| Example 8 | 40 | 0.40 | HC agent (1) | 2.0 | HC agent (3) | 91.5 | 0.3 | 96.6 | 0.3 | 0.2 | 12.8 | 0.005 | 0.036 |
| Example 9 | 40 | 1.0 | HC agent (1) | 1.1 | HC agent (1) | 91.9 | 0.4 | 96.7 | 0.2 | 0.2 | 9.2 | 0.008 | 0.054 |

TABLE 2

| | Transparent piezoelectric base film Thickness (μm) | Transparent coating layer A Thickness (μm) | Transparent coating layer A Type | Transparent coating layer B Thickness (μm) | Transparent coating layer B Type | Optical characteristics Total light transmittance (%) | Haze (%) | L* (—) | a* (—) | b* (—) | Piezoelectric constant $d_{33}$ (pC/N) | Surface roughness Ra (μm) | Rz (μm) |
|---|---|---|---|---|---|---|---|---|---|---|---|---|---|
| Comparative Example 1 | 40 | — | — | — | — | 93.8 | 2.3 | 96.8 | 0.1 | 0.7 | 18.6 | 0.023 | 0.19 |
| Comparative Example 2 | 40 | 3.2 | HC agent (1) | 3.1 | HC agent (1) | 91.5 | 0.5 | 96.7 | 0.2 | 0.5 | 5.9 | 0.008 | 0.054 |
| Comparative Example 3 | 40 | 4.0 | HC agent (2) | 4.1 | HC agent (2) | 91.7 | 0.5 | 96.4 | 0.1 | 0.4 | 5.1 | 0.008 | 0.053 |

Discussion

All of the piezoelectric films of Examples 1 to 9 have both sufficient transparency and sufficient piezoelectric properties. Regarding the transparency, it is thought that the irregularities formed on the surface of the transparent piezoelectric base film were filled with the transparent coating layer and a sufficiently smooth surface was formed, and as a result, the haze was further reduced. Regarding the piezoelectric properties, it is thought that the deformability of the transparent piezoelectric base film in the thickness direction is sufficiently maintained because the transparent coating layer is sufficiently thin.

On the other hand, the piezoelectric film of Comparative Example 1 has a higher haze value than the piezoelectric films of Examples 1 to 9, and is insufficient in terms of transparency. This is thought to be due to the influence of light scattering caused by the surface shape of the transparent piezoelectric base film.

In addition, each of the piezoelectric films of Comparative Examples 2 and 3 is insufficient from the viewpoint of piezoelectric properties as compared with the piezoelectric films of Examples 1 to 9. This is thought to be because the transparent coating layer is too thick and thus the deformability of the transparent piezoelectric base film in the thickness direction is more limited.

INDUSTRIAL APPLICABILITY

The present invention can be used in a touch panel.

REFERENCE SIGNS LIST

1 Transparent piezoelectric base film
2, 2*a*, 2*b* Transparent coating layer
3*a*, 3*b*, 3*c*, 3*d* Transparent adhesive layer
4*a*, 4*b*, 4*c* Transparent electrode
5 Cover glass
6*a*, 6*b*, 6*c* Transparent substrate
10, 20 Piezoelectric film
30 Display
100 Touch panel

The invention claimed is:

1. A piezoelectric film comprising, by stacking:
a transparent piezoelectric base film made of a fluororesin; and
a transparent coating layer having a thickness of 0.20 to 2.5 μm,
wherein the transparent coating layer includes at least one resin selected from a melamine resin, a urethane resin, an alkyd resin, an acrylic resin, and a silicone resin, and is in direct contact with the transparent piezoelectric base film over an entire region overlapping the transparent piezoelectric base film, thereby forming an interface with the piezoelectric base film.

2. The piezoelectric film according to claim 1, wherein haze is 2.0% or less.

3. The piezoelectric film according to claim 1, wherein a piezoelectric constant $d_{33}$ is 8.0 to 30.0 pC/N.

4. The piezoelectric film according to claim 1, wherein a total light transmittance is 80% or more.

5. The piezoelectric film according to claim 1, wherein a maximum height Rz of surface roughness of a surface of the transparent coating layer is 0.10 μm or less.

6. The piezoelectric film according to claim 1, wherein the transparent piezoelectric base film has a thickness of 20 to 100 μm.

7. The piezoelectric film according to claim 1, wherein the transparent coating layer is stacked on both surfaces of the transparent piezoelectric base film.

8. A touch panel comprising the piezoelectric film described in claim 1.

9. A piezoelectric film manufacturing method for manufacturing the piezoelectric film recited in claim 1 comprising:

a step of forming a transparent coating layer having a thickness of 0.20 to 2.5 μm on at least one surface of a transparent piezoelectric base film made of a fluororesin, wherein the step of forming the transparent coating layer includes a step of applying a coating material for producing the transparent coating layer to at least one surface of the transparent piezoelectric base film, and a step of solidifying the coating film formed in the applying step.

* * * * *